United States Patent [19]

Frohman-Bentchkowsky

[11] 3,825,946

[45] July 23, 1974

[54] ELECTRICALLY ALTERABLE FLOATING GATE DEVICE AND METHOD FOR ALTERING SAME

[75] Inventor: Dov Frohman-Bentchkowsky, Los Altos, Calif.

[73] Assignee: Intel Corporation, Santa Clara, Calif.

[22] Filed: Oct. 19, 1973

[21] Appl. No.: 407,910

Related U.S. Application Data

[63] Continuation-in-part of Ser. No. 300,563, Oct. 25, 1972, abandoned, which is a continuation of Ser. No. 106,643, Jan. 15, 1971, abandoned.

[52] U.S. Cl. ........................ 357/23, 357/41, 357/54

[51] Int. Cl. ........................................... H01l 11/14

[58] Field of Search ....... 317/235 B, 235 G, 235 AZ

*Primary Examiner*—Martin H. Edlow

[57] ABSTRACT

A field effect device having a floating gate which can be charged or discharged electrically is disclosed. A pair of spaced apart regions in a substrate define a channel above which a floating gate is disposed and insulated from the channel. The regions have a conductivity type opposite to the substrate. A second gate is disposed above and insulated from the floating gate. The floating gate may be charged electrically by producing an avalanche breakdown at the junction formed by one of the spaced apart regions and the substrate causing the passage of electrons through the insulation onto the floating gate. The floating gate may be discharged by the application of a voltage to the second gate relative to the spaced apart regions and substrate causing the passage of electrons from the floating gate through the insulation onto the second gate.

13 Claims, 7 Drawing Figures

DOV FROHMAN-BENTCHKOWSKY
INVENTOR

BY Spensley, Horn & Lubitz
ATTORNEYS

DOV FROHMAN-BENTCHKOWSKY
INVENTOR.

BY Spensley, Horn & Lubitz
ATTORNEYS

ELECTRICALLY ALTERABLE FLOATING GATE DEVICE AND METHOD FOR ALTERING SAME

This is a continuation-in-part application of Ser. No. 300,563 filed Oct. 25, 1972, now abandoned which was a continuation of Ser. No. 106,643 filed Jan. 15, 1971, now abandoned.

BACKGROUND OF THE INVENTION

1. Field of the Invention

The invention relates to the field of storage or memory devices and methods for electrically altering such devices.

2. Prior Art

In U.S. Letters Pat. No. 3,500,142 and 3,755,721, floating gate transistors and electrical methods for charging the transistors were described. In these patents certain prior art was discussed. Briefly, the prior art devices employed different principles of operation. These different principles are manifested by (1) use of thin composite dielectric layers (as compared with a relatively thick single dielectric; e.g., in excess of 500–1,000 A, which may be employed in the present invention); (2) use of high fields to obtain tunneling (as compared with the low field injection employed in the present invention); and (3) use of second gate within the active area of the device for charging (e.g., as compared with the present invention where a second gate may be employed outside the active area and is not necessary for charging).

The devices described in the above mentioned patents generally comprise a floating silicon gate, preferably of p-type silicon which was completely surrounded by silicon oxide and disposed between a pair of p+ regions which defined a channel in an n-type silicon substrate. In these patents, a method was discussed for placing an electrical charge on the floating gate by causing an avalanche breakdown between one of the p+ regions and the substrate. This caused the injection of electrons into the floating gate thereby charging the floating gate. The method for removing the charge discussed in these patents was primarily the application of x-rays or ultra-violet light to the transistor which caused the charge on the floating gate to be removed.

In the present application, a similar device is described but wherein an additional gate is utilized to electrically remove the charge from the floating gate. In an alternate embodiment of this device, wherein two additional gates in addition to the floating gate are utilized, a charge is placed onto and removed from the floating gate without inducing current flow between the p+ regions. Thus, the present invention provides an electrical method for removing the charge in a floating gate device thereby providing an alternate method of removing the charge previously discussed, that is, the application of ultra-violet light or x-rays to the transistor. This method is particularly advantageous in that no additional special equipment is required by the user to erase or alter the stored information. In addition, each individual bit of stored information may be readily altered.

SUMMARY OF THE INVENTION

A field effect device which in the presently preferred embodiment contains a pair of spaced apart regions (e.g., source and drain) which define a channel in an opposite conductivity type silicon substrate. A doped polycrystalline silicon floating gate is disposed above the channel and completely surrounded by silicon oxide. A second gate is disposed above and insulated from the floating gate. Electrical contact is made with the source and drain regions as is typically done in field effect devices. A charge is placed onto the floating gate by causing an avalanche breakdown between at least one of the regions and the substrate (or by causing avalanche injection from the surface of both regions). The charge is electrically removed from the floating gate by applying a voltage to the second gate, said voltage being of a proper polarity relative to the voltage maintained at the source and drain regions and substrate. The charge may also be removed from the floating gate by the application of a voltage to the source and drain regions, said voltage being of the proper polarity with respect to the voltage at which the second gate and substrate are maintained.

DETAILED DESCRIPTION OF THE INVENTION

Figure 1:
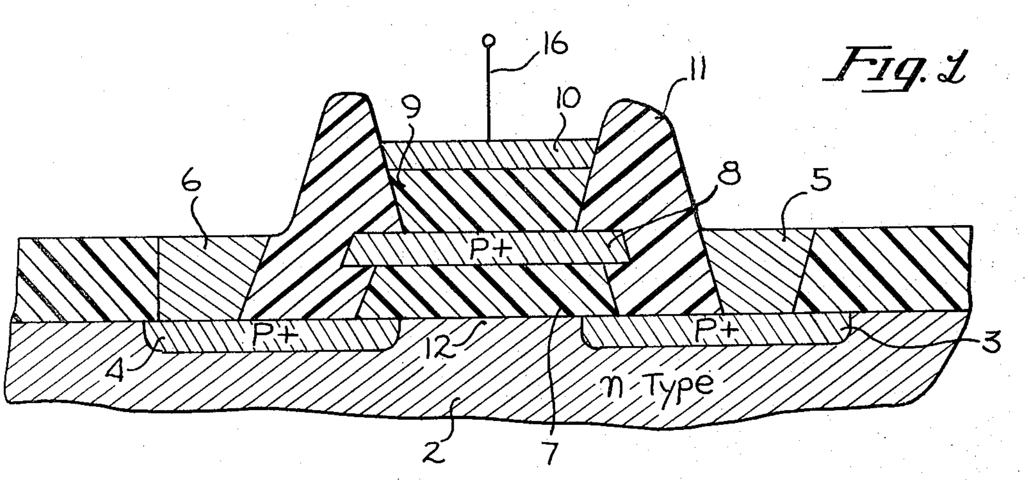
FIG. 1 is a cross-sectional view of an embodiment of a floating gate device built in accordance with the teaching of the present invention.

Referring to FIG. 1, the device of the presently preferred embodiment is illustrated as part of a substrate 2 of an n-type silicon material. Two p+ regions 3 and 4, which are commonly referred to as the drain and source regions, are spaced apart in substrate 2 thereby defining a channel 12. A silicon floating gate 8 is disposed above the channel 12 and insulated therefrom by a silicon oxide layer 7. This layer in the presently preferred embodiment is at least approximately 1,000 A. A second gate 10 in the presently preferred embodiment is a metal gate which is coupled to a lead 16. Gate 10 is disposed above the floating gate 8 and insulated therefrom by a silicon oxide layer 9. This layer in the presently preferred embodiment is at least approximately 1,000 A. Metal contacts 5 and 6 are coupled to the regions 3 and 4, respectively, in order that electrical contact may be readily made with these regions. The insulative layers 7, 9 and 11 may comprise silicon oxide (e.g., $S_iO$, $S_iO_2$) which is deposited or grown.

In the embodiment of FIG. 1, the floating gate 8 is surrounded with insulative material. The gate 8 in the presently preferred embodiment is a polycrystalline p-type silicon. This silicon gate 8 is utilized with an n-type substrate 2, but other materials and conductivity type substrates and other types of gate materials such as metal gates may be utilized. For the advantages and technology associated with the use of a silicon gate, see IEEE Spectrum, Vol. 6, No. 10, October 1969, Silicon Gate Technology, page 28, Vadasz, Grove, Rowe and Moore. The device of FIG. 1 may be manufactured utilizing such known techniques.

With the device illustrated in FIG. 1, an electrical charge may be placed on the floating gate 8 by the methods discussed in the previously mentioned patent. For example, a voltage may be applied to either contacts 5 or 6, said voltage being negative relative to the substrate 2 and the other contact and of sufficient magnitude to cause a breakdown in the junction defined by the region coupled to the contact and the substrate. This breakdown causes an injection of electrons onto the floating gate 8. As explained in the previously mentioned patents, once the gate 8 is charged, the characteristics of the device illustrated in FIG. 1 will be substantially changed (e.g., conductive or non-conductive) thus allowing the device to be utilized along with numerous other devices in such applications as memory devices.

Avalanche injection of carriers into thermal oxide in response to the application of a voltage on a metal electrode of an MOS capacitor has been reported by E. H. Nicollian and A. Goetzberger, Transaction of Electronic Devices, ED–15, 686 (1968). The phenomena therein described may be useful in understanding the mechanism by which the charge is placed onto the floating gate 8.

In accordance with the teachings of the present invention, the charge on the floating gate 8 may be removed by the application of a voltage to lead 16, said voltage being positive relative to the voltage applied to or maintained on contacts 5, 6 and the substrate 2. For example, if the substrate 2 and the contacts 5 and 6 are at ground potential for the device herein described, a voltage of approximately 35 volts applied to second gate 10 through lead 16 will cause the charge to be removed from the floating gate 8. While the floating gates of the present invention are charged by avalanche injection from at least one junction in the substrate the applicant is not certain of the mechanism by which charge is removed. In tests the floating gate was discharged through approximately 1,000 A of $S_iO_2$ between the floating gate and upper gate with approximately 30V between the upper gate and substrate. This corresponds to an electric field of $< 3.0\times10^6$V/cm which is below the field necessary for tunneling.

The charge may also be removed from the floating gate 8 by the application of a voltage to the regions 3 and 4, said voltage being negative with respect to the voltage applied to the second gate 10 and substrate 2.

Figure 2:
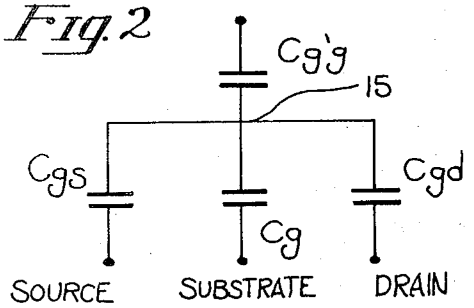
FIG. 2 is a diagram illustrating the various capacitances associated with the device of FIG. 1.

Referring to FIG. 2, the various capacitances associated with the device of FIG. 1 are illustrated. The capacitance between the second gate 10 and floating gate 8 is represented in FIG. 2 as $C_{g'g}$. The junction 15 in FIG. 2 represents the floating gate 8. The capacitance associated with the region 4 and the floating gate 8 is represented as $C_{gs}$ (gate to source), the capacitance associated with the floating gate 8 and substrate 2 is represented by $C_g$ and the capacitance associated with the region 3 and floating gate 8 is represented by $C_{gd}$ (gate to drain). In order for the charge to be readily removed from the gate 8, the majority of the electric field associated with the difference in potential between the gate 10 and the substrate 2, and regions 3, 4 should be across the insulative layer 9. From FIG. 2, it can be readily seen that one way to have the maximum of electric field across layer 9 is to have the ratio of the capacitance $C_{g'g}$ and the combination of $C_{gs}$, $C_g$ and $C_{gd}$ relatively small. For example, if:

$$(C_{g'g}/C_{gs} + C_{gd} + C_g) \approx 0.1$$

then the charge may be readily removed from the floating gate 8 for the device illustrated in FIG. 1 by the application of a voltage of approximately 35 volts to gate 10 through lead 16, this voltage being well below that voltage which would cause permanent damage to the oxide layers 7 or 9. This ratio of capacitance is readily attainable for the device illustrated in FIG. 1 utilizing known MOS technology.

If this electrically alterable storage device is to be implemented in an integrated circuit memory array, it would be desirable to discharge the floating gate with the same polarity voltage as is required for charging the gate. This feature will facilitate the incorporation on a single chip of the memory storage devices and the decoding circuitry for the memory array.

Charge can be removed from the floating gate 8 by application of a negative voltage to the source and drain (regions 3 and 4) with the upper gate 10 and substrate 2 at ground potential. However, to do so the following ratio of capacitances should be achieved:

$$(C_{g'g} + C_g/C_{gs} + C_{gd}) \sim .1$$

so that most of the applied voltage is dropped across the $C_{g'g}$ capacitance.

Since $C_{gs}$ and $C_{gd}$ are typically smaller than $C_g$ it may be difficult to achieve the proper capacitance ratio for the device illustrated in FIG. 1. One method of overcoming this problem is illustrated in FIG. 4 which shows the use of a third gate 27.

Figure 4:
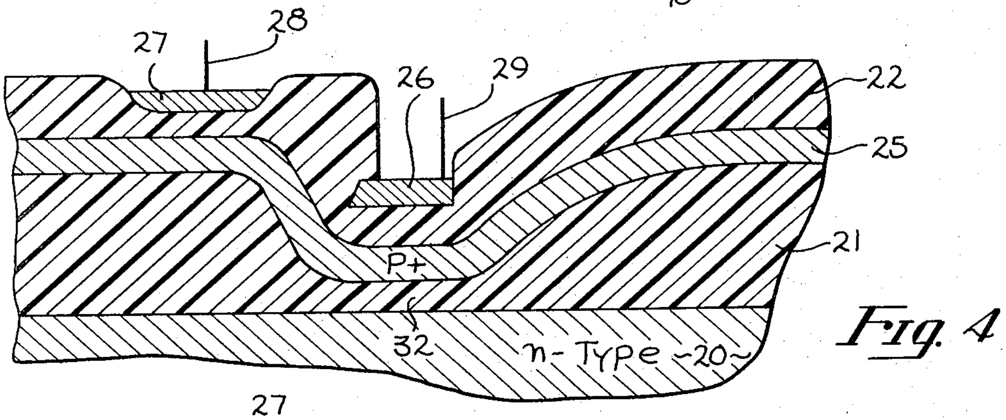
FIG. 4 is an alternate embodiment of the device of FIG. 1 wherein a third metal gate is utilized with the view taken along the channel of the device.
Figure 5:
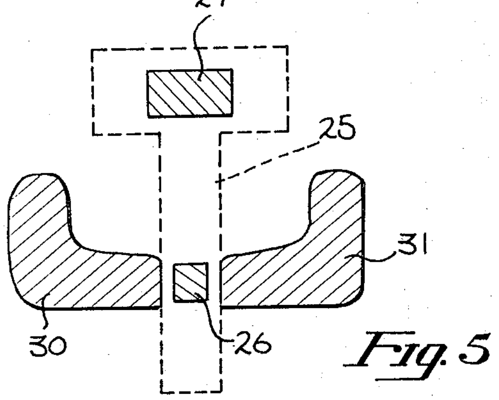
FIG. 5 is a plan view of the device of FIG. 4.

FIGS. 4 and 5 illustrate another embodiment of a memory or storage device which contains an additional gate 27. Note that the view of FIG. 4 is taken along the channel of a field effect device and thus the source and drain regions illustrated in FIG. 1 do not appear in this view. The device of FIGS. 4 and 5 in the present embodiment comprises an n-type silicon substrate 20, a pair of spaced apart p-type regions commonly referred to as a source and drain (not illustrated in FIG. 4 but illustrated in the plan view of the device of FIG. 5 as regions 30 and 31). The floating gate 25 is generally an elongated gate of a p-type silicon material. The gate 25 is completely surrounded by insulation which in the presently preferred embodiment is silicon oxide, illustrated as layers 21 and 22. The floating gate 25 has a rectangular end portion above which the third gate 27 is disposed. The gate 25 in the presently preferred embodiment is separated from the substrate 20 in the area between the p-type regions 30 and 31 by an oxide layer of approximately 1,000 A. This area is illustrated as area 32 in FIG. 4. The remainder of the gate 25 is separated from the substrate 20 by a considerably thicker insulation. The second gate 26, which may be an ordinary metal gate, is separated from the floating gate 25 by approximately 1,000 A of oxide in the presently preferred embodiment. The gate 26 is disposed above and between the p-type regions 30 and 31 (source and drain). The third gate 27 which may be a metal gate is disposed above the end of the floating gate 25 which comprises a rectangular area and is separated from the floating gate by approximately 1,000 A of silicon oxide in the presently preferred embodiment. Lead 28 is coupled to gate 27, and lead 29 is coupled to gate 26. The device illustrated in FIGS. 4 and 5 may be produced utilizing known MOS technology as is the case with the device of FIG. 1. The device of FIGS. 4 and 5 may be constructed utilizing other conductivity types as well as other semiconductor materials.

Assume that the capacitance between the third gate 27 and the floating gate 25 is $C_{g''g}$ that the capacitance between the p-type regions 30 and 31 and floating gate are respectively $C_{gs}$ and $C_{gd}$ that the capacitance between the floating gate 25 and substrate 20 is $C_g$ and that the capacitance between the second gate 26 and the floating gate 25 is $C_{g'''g}$. As previously discussed, it is possible to discharge an electrical charge on the floating gate 8 of FIG. 1 by applying a negative voltage with respect to the substrate and second gate 10 to the source and drain via contacts 5 and 6. But, also as previously discussed, it may be difficult to achieve the proper ratio of capacitance in order to produce an electric field of sufficient strength to remove the charge from floating gate 8. With the addition of the third gate 27 as illustrated in FIG. 4, it can be readily seen that the ratio of capacitance represented by equation 2 if the third gate is also maintained at −V potential now becomes:

$$C_{g''g} + C_g / C_{gs} + C_{gd} + C_{g'''g}$$

Thus, the capacitance caused by the third metal gate 27 ($C_{g''g}$) is in parallel with $C_{gs}$ and $C_{gd}$ thus allowing the capacitance associated with $C_{g''g}$ to be constructed in order to achieve a low ratio of capacitance (e.g., 0.1).

To discharge a charge which has been placed on the floating gate 25 of the devices of FIGS. 4 and 5 through the regions 30 and 31, the substrate 20, second gate 26 and third gate 27 may be held at grounded potential and a negative voltage applied to regions 30 and 31. This allows charge to be removed from the floating gate 25 with a relatively low voltage. This voltage being well below the voltage which would cause a permanent damage to any of the structures of the device.

In addition to allowing the same voltage polarity for charging and discharging, the device in FIGS. 4 and 5 can also be operated in a different charging mode from that described for the device in FIG. 1. As illustrated above, the additional third gate if properly biased can be used to control the voltage drops across the structure. If lead 28 is maintained at ground potential (instead of −V) when both source and drain are biased at −V with respect to the grounded substrate and gate 26, the capacitance ratio in equation 2 representing the voltage distribution in the structure becomes:

$$C_{g''g} + C_g + C_{g'''g} / C_{gs} + C_{gd}$$

Since this ratio is greater than 1 most of the applied voltage is dropped between the floating gate and the source and drain regions across the capacitors $C_{gs}$ and $C_{gd}$. For a sufficiently large value of −V (~ 35.0 volt) the positively biased floating gate will cuase avalanche injection of electrons from the source and drain junctions to the floating gate. This constitutes a new mode of charging the floating gate in which both source and drain are held at the same potential and hence no current flow occurs between these regions during charging.

In the tables below, two modes of operation of the device of FIGS. 4 and 5 are shown. Mode 1 being a charging and discharging method wherein the charging is performed as explained in the previous application and wherein the discharging is performed as explained herein. In this mode, the charging involves current flow between drain and source, since a conductive path is induced between the two regions. Mode 2 illustrates the alternate method of charging for the device in FIGS. 4 and 5 in which the floating gate is charged by avalanche injection from the source and drain regions simultaneously. In this mode, the source and drain are at the same negative potential with respect to the floating gate, hence there is no current flow between the two regions. This injection is characterized by relatively low voltages under 50 volts and a thick oxide layer that is of the order of approximately 1,000 A and in excess thereof. In the following table "D" represents the voltage applied to the drain (for example, region 30 of FIG. 5) and "S" the voltage applied to the source (for example, region 31 of FIG. 5). The second metal gate is illustrated as gate 26 in FIG. 4 and the third metal gate is illustrated as gate 27 in FIG. 4. −V in the table means a negative voltage is applied to the indicated portion of the device, +V means a positive voltage is applied to the indicated portion of the device, and "0" indicates that the indicated portion of the device is held at ground potential. The operation column indicates whether the device is charging or discharging during the particular exemplary voltage conditions. Thus, by way of example, a charge may be placed on the floating gate 25 by placing a negative voltage on regions 30 and 31 of the device illustrated in FIGS. 4 and 5 while coupling leads 28 and 29 to ground potential (as shown in Mode 2, first line).

MODE 1

| Operation | D | S | 2nd Gate | 3rd Gate |
|---|---|---|---|---|
| Charge | −V | 0 | 0 | 0 |
| Discharge | 0 | 0 | +V | 0 |

MODE 2

| Operation | D | S | 2nd Gate | 3rd Gate |
|---|---|---|---|---|
| Charge | −V | −V | 0 | 0 |
| Discharge | −V | −V | 0 | −V |

The −V and +V and "0's" illustrated in the above tables are utilized only to indicate the relative differences in potential between the various portions of the device. Thus, by way of example in Mode 1 under the row labeled "Charge," the drain may be held at "0" potential and a positive potential applied to the source, substrate, second gate and third gate.

It should be noted that when the appropriate voltages are applied to the device described herein to remove the excess electrons stored on the floating gate, the voltages will also partially deplete the silicon gate of electrons by the same mechanism if no excess charge is present on the gate. This will result in a negative shift of turn on voltage of the device. Thus, in designing a memory which utilizes the devices described herein, a selection of the charging and discharging voltages or adjustments thereof may be required in order that a subsequent voltage intended to charge the floating gate is of sufficient magnitude to charge the floating gate even if the floating gate is partially depleted of electrons.

Figure 3:
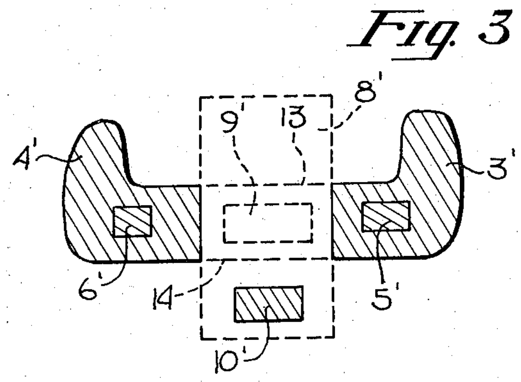
FIG. 3 is an alternate embodiment of the device of FIG. 1 wherein the second metal gate is not over the active portion of the device.

Referring to FIG. 3, an alternate embodiment of the device of FIG. 1 is illustrated in plan view. In the device illustrated in FIG. 3, the various components of the device of FIG. 1 are shown with primes on the corresponding number. For example, the p-region 4 of the device 1 is illustrated as 4′ in FIG. 3. The regions 3′ and 4′ of FIG. 3 may be similar in construction and produced on a substrate such as the one illustrated in FIG. 1. The contacts 5′ and 6′ may be similar to the contacts 5 and 6 of FIG. 1. The floating gate 8′ of FIG. 3 is elongated and extends beyond the active area of the device that is beyond the areas illustrated by the dotted lines 13 and 14. The silicon gate 8′ is again completely surrounded with an insulative material such as silicon oxide and is separated from the substrate between lines 13 and 14 by approximately 1,000 A of insulation in the presently preferred embodiment. The remainder of the gate 8′ may be separated from the substrate by a greater thickness of oxide. The second gate 10′ is disposed above the floating gate 8′ in an area outside of the active area of the device and in the presently preferred embodiment is separated from the silicon gate 8′ by approximately 1,000 A of silicon oxide. The operation of the device illustrated in FIG. 3 is the same as that illustrated in FIG. 1.

The device of FIG. 3 has an advantage over the device of FIG. 1 in terms of its ease of manufacture in that the second gate 10′ is not produced over the active area of the device.

Figure 6:
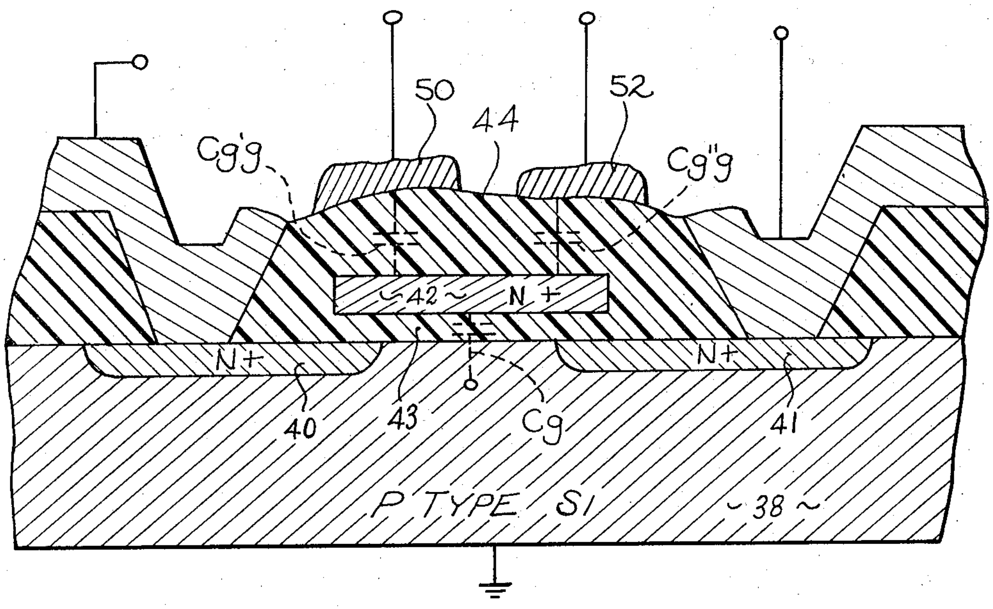
FIG. 6 is an alternate embodiment of the invention employing a p-type substrate.

Another alternate embodiment of the invention is shown in FIG. 6 wherein a p-type substrate is employed and the conductance between two n+ regions is modulated by the storage of charge on the n+ floating gate 42. Briefly, the embodiment of FIG. 6 employs a p-type substrate 38, an n+ polycrystalline silicon gate 42 separated from the substrate 38 by an insulative layer of oxide 43 in the order of 500–1,000 A, and surrounded by such a layer of insulative material. The substrate 38 contains n+ regions 40 and 41 which function primarily to sense the status of the floating gate device, that is, whether or not a charge is stored by gate 42. A pair of gates 50 and 52 fabricated from a conductive material such as aluminum are located above gate 42 and as explained later are employed for charging and discharging gate 42. Typically, the gates 50 and 52 are separated from gate 42 by a layer 44 of insulative material of approximately 500–1,000 A or similarly thick insulating materials. In FIG. 6, the primary capacitances involved in the operation of the device are indicated by broken lines and designated $C_{g'g}$; $C_{g''g}$ and $C_g$.

It may be shown that avalanche injection through a thermal oxide by deep depletion of a silicon substrate leads to significant current densities only for electrons injected from a p-type silicon layer while the hole current from an n-type silicon layer are a few orders of magnitude lower. In operation, the floating gate is charged by avalanche injection from the p-type substrate and discharged from the n-type silicon gate to either gate 50 or 52. For most desirable operation, a proper capacitance ratio should be maintained between the different capacitances and the structure. A positive voltage pulse applied to gate 52 with gate 50 grounded will create a voltage drop primarily across $C_g$ if:

$$C_g + C_{g'g}/C_{g''g} << 1$$

When this is so, with the positive pulse applied to gate 52 and with source 40 and drain 41 positively biased, the result will be an avalanche injection from the p-type substrate 38 to the floating gate 42. To discharge the floating gate 42 a positive voltage is applied to gate 50 with gate 52, source 22 and drain 24 grounded. The two n+ regions 40 and 41 are used primarily to sense the presence or absence of the charge on the gate by measuring the conductance between the regions 40 and 41.

Figure 7:
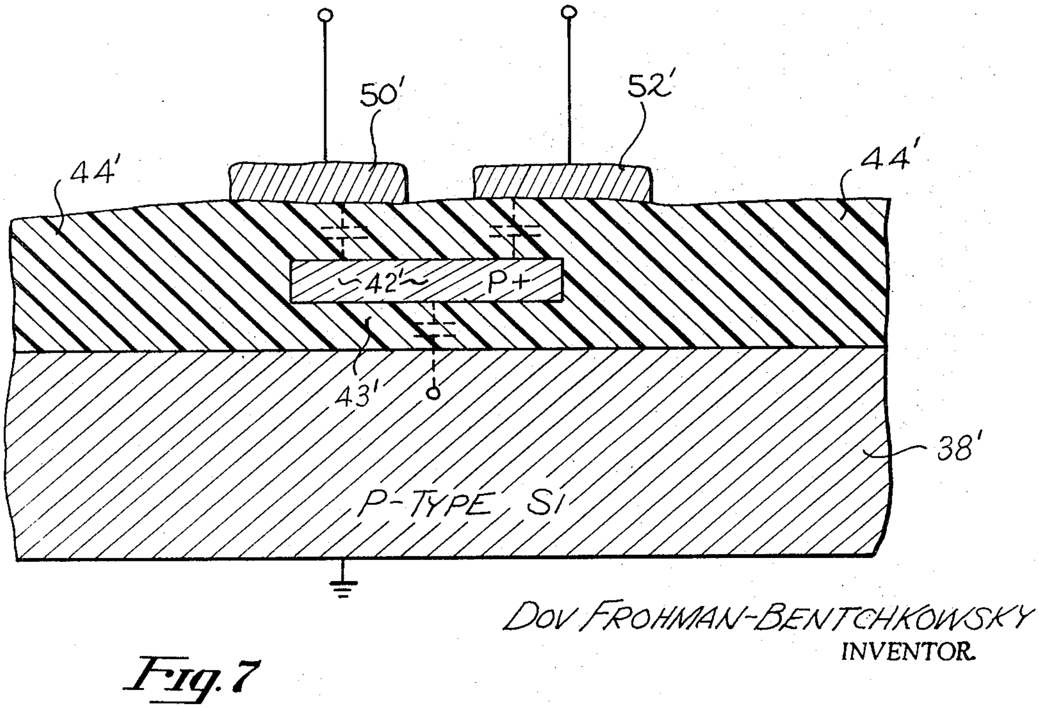
FIG. 7 is another alternate embodiment of the invention without source and drain regions.

A final embodiment described in detail herein is shown in FIG. 7. The main semiconductor structural variation in this embodiment when compared to that of FIG. 6 is the elimination of source 40 and drain 41 and the connections thereto. In the embodiment of FIG. 7, if the capacitance ratio of capacitance of $C_{g'g}$ and $C_{g4g}$ is such that $C_{g''g}$ is approximately ~ 0.1 × $C_{g'g}$ then charging and discharging of a p+ type floating silicon gate 42′ can be accomplished as follows note that a p type gate is used in the embodiment of FIG. 7 as opposed to the n type gate of FIG. 6.

A positive voltage pulse of approximately 35 volts applied to gate 50′ and 52′ with the substrate 38′ grounded will cause the voltage drop to occur primarily across capacitance $C_g$ and cause injection from the p-type substrate to the floating gate 42′. To discharge the gate, a positive pulse (e.g., approximately 35 volts) is applied to gate 50′ with gate 52′ and substrate 38′ grounded. This results in a loss of charge from the floating gate 42′ to the metal gate 50′. Sensing of the charged state of the gate can be accomplished by well known capacitance sensing arrangements which would sense the capacitance variation between gate 50′ and ground due to the presence or absence of charge on floating gate 42′.

Thus, a method has been disclosed for electrically altering the charge placed on a floating gate. Alternate embodiments of a device which allow the charge to be removed by the application of a voltage to the source and drain regions rather than through the second gate has also been illustrated. This alternate embodiment has the advantage that no current flows between the source and drain regions during the charging of the floating gate. U.S. Letters Pat. No. 3,728,695 discloses circuits in which the presently disclosed devices may be used.

I claim:

1. A storage device into which information may be electrically placed and electrically removed comprising:

a substrate of a first conductivity type;

a pair of spaced apart regions in said substrate and of opposite conductivity type to said substrate, said regions defining a channel area in said substrate;

a floating gate disposed above said channel area and insulated from said channel area and having a portion extending beyond said channel area of said spaced apart regions;

a second gate disposed above said floating gate and insulated from said floating gate;

a third gate disposed above said floating gate and insulated from said floating gate and said second gate, said third gate located above said extended portion of said floating gate in an area beyond the area of said spaced apart region, said second and third gates adapted to conductively enable a discharge from said floating gate to take place; and electrical means coupled to at least one of said spaced apart regions for causing an avalanche injection from at least one of the junctions defined by one of said spaced apart regions on said substrate to said floating gate for charging said floating gate;

whereby electrical charge may be placed on and removed from said floating gate.

2. The device defined in claim 1 wherein said substrate is n-type silicon, said spaced apart regions are p-type silicon and said floating gate is p-type silicon.

3. The device defined in claim 2 wherein silicon oxide insulation is disposed between said floating gate and substrate, between said floating gate and second gate and between said second gate and said third gate.

4. The device defined in claim 3 wherein said floating gate is completely surrounded by silicon oxide.

5. A storage device into which information may be electrically placed and electrically removed comprising:

a substrate of a first conductivity type;

a pair of spaced apart regions in said substrate of opposite conductivity type to said substrate, said regions defining a channel;

a floating gate disposed above said channel and insulated from said channel;

a second gate disposed above said floating gate and insulated from said floating gate for discharging said floating gage;

electrical means coupled to at least one of said spaced apart regions for causing an avalanche injection from the junction defined by one of said spaced apart regions and said substrate to said floating gate for charging said floating gate;

whereby electrical charge may be placed on and removed from said floating gate.

6. The device defined in claim 5 wherein said floating gate comprises p-type silicon.

7. The device defined in claim 5 wherein said substrate is insulated from said floating gate by silicon oxide insulation and wherein said second gate is insulated from said floating gate by silicon oxide insulation.

8. An electrically programmable memory device comprising:

a substrate of a first conductivity type;

a pair of spaced apart regions of opposite conductivity type to said first conductivity type disposed in said substrate;

a floating gate disposed between said spaced apart regions;

a second gate disposed above said floating gage for removing a charge from said floating gate;

a third gate disposed above said floating gate and insulated from said floating gate and said second gate, said second and third gate adapted to cooperatively enable discharge to take place from said floating gate; and electrical means coupled to at least one of said spaced apart regions for causing an avalanche injection from the junction defined by one of said spaced apart regions and said substrate to said floating gate for charging said floating gate;

whereby electrical charge may be placed on and removed from said floating gate.

9. The device defined in claim 8 wherein said floating gate comprises silicon.

10. The device defined in claim 9 wherein said floating gate is insulated from said substrate by silicon oxide insulation and wherein said third gate is insulated from said floating gate and said second gate by silicon oxide insulation.

11. The device defined in claim 8 wherein said floating gate extends beyond a channel defined by said spaced apart regions and said second gate is laterally displaced from said channel.

12. A storage device into which information may be electrically placed and electrically removed comprising:

a substrate of a first conductivity type;

a pair of spaced apart regions in said substrate of opposite conductivity type to said substrate, said regions defining a channel;

a floating gate disposed above said channel and insulated from said channel by insulation of at least approximately 1,000 A thick;

a second gate disposed above said floating gate and insulated from said floating gate, said second gate adapted to cooperatively enable a discharge to take place from said floating gate; and electrical means coupled to at least one of said spaced apart regions for causing an avalanche injection from the junction defined by one of said spaced apart regions and said substrate to said floating gate whereby charging said floating gate;

whereby electrical charge may be placed on and removed from said floating gate.

13. The device defined in claim 12 including a third gate disposed above said floating gate and insulated from said floating gate and said second gate, said second and third gate adapted to cooperatively enable a discharge to take place from said floating gate.

* * * * *